United States Patent
Mueller et al.

(10) Patent No.: US 10,825,820 B2
(45) Date of Patent: Nov. 3, 2020

(54) METHOD FOR MANUFACTURING A MICROELECTRONIC CIRCUIT AND CORRESPONDING MICROELECTRONIC CIRCUIT

(71) Applicant: Fraunhofer-Gesellschaft zur Foerderung der angewandten Forschung e.V, Munich (DE)

(72) Inventors: Johannes Mueller, Dresden (DE); Patrick Polakowski, Dresden (DE); Maximilian Drescher, Dresden (DE); Stefan Riedel, Dresden (DE)

(73) Assignee: Fraunhofer-Gesellschaft zur Foerderung der angewandten Forschung e.V, Munich (DE)

( * ) Notice: Subject to any disclaimer, the term of this patent is extended or adjusted under 35 U.S.C. 154(b) by 0 days.

(21) Appl. No.: 16/174,189

(22) Filed: Oct. 29, 2018

(65) Prior Publication Data
US 2019/0067297 A1    Feb. 28, 2019

Related U.S. Application Data

(63) Continuation of application No. 15/409,818, filed on Jan. 19, 2017, now Pat. No. 10,115,727.

(30) Foreign Application Priority Data

Jan. 19, 2016   (DE) .................. 10 2016 200 597

(51) Int. Cl.
*H01L 27/108*    (2006.01)
*H01L 21/28*    (2006.01)
(Continued)

(52) U.S. Cl.
CPC .. *H01L 27/10894* (2013.01); *H01L 27/10808* (2013.01); *H01L 27/10826* (2013.01);
(Continued)

(58) Field of Classification Search
CPC ........... H01L 27/10894; H01L 27/1085; H01L 27/108; H01L 27/11502; H01L 21/823431
See application file for complete search history.

(56) References Cited

U.S. PATENT DOCUMENTS

| | | | |
|---|---|---|---|
| 2002/0024073 A1* | 2/2002 | Shimada | G11C 11/22 257/295 |
| 2007/0045689 A1 | 3/2007 | Lim et al. | |

(Continued)

*Primary Examiner* — Jae Lee
(74) *Attorney, Agent, or Firm* — Michael A. Glenn; Perkins Coie LLP

(57) ABSTRACT

The invention relates to a method for manufacturing a microelectronic circuit. A substrate is provided. A source contact, a bulk contact and a drain contact are each produced for a transistor and for a memory transistor. In a respective common step, an insulating layer of the transistor and an insulating layer of the memory transistor as well as a metal layer of the transistor and a metal layer of the memory transistor are produced. At least one capacitor is produced as part of the memory transistor. Gate contacts connected to the metal layer of the transistor and connected to a metal layer of the capacitor of the memory transistor, respectively, are produced. Furthermore, the invention relates to a microelectronic circuit.

4 Claims, 9 Drawing Sheets

(51) Int. Cl.
  *H01L 29/51*   (2006.01)
  *H01L 29/66*   (2006.01)
  *H01L 27/1159* (2017.01)
  *H01L 29/78*   (2006.01)
  *H01L 29/10*   (2006.01)

(52) U.S. Cl.
  CPC .. *H01L 27/10855* (2013.01); *H01L 27/10879* (2013.01); *H01L 27/1159* (2013.01); *H01L 29/1087* (2013.01); *H01L 29/40111* (2019.08); *H01L 29/516* (2013.01); *H01L 29/6684* (2013.01); *H01L 29/78391* (2014.09); *H01L 29/78* (2013.01)

(56) References Cited

U.S. PATENT DOCUMENTS

| | | |
|---|---|---|
| 2009/0061538 A1 | 3/2009 | Heo et al. |
| 2010/0190334 A1 | 7/2010 | Lee |
| 2012/0028434 A1 | 2/2012 | Lee et al. |
| 2013/0270619 A1 | 10/2013 | Schloesser et al. |
| 2014/0355328 A1 | 12/2014 | Müller et al. |

* cited by examiner

METHOD FOR MANUFACTURING A MICROELECTRONIC CIRCUIT AND CORRESPONDING MICROELECTRONIC CIRCUIT

CROSS-REFERENCE TO RELATED APPLICATIONS

This application is a Division of U.S. patent application Ser. No. 15/409,818 filed Jan. 19, 2017, now U.S. Pat. No. 10,115,727, issued on Oct. 30, 2018, which claims priority from German Patent Application No. 10 2016 200 597.9, which was filed on Jan. 19, 2016, which are each incorporated herein in its entirety by this reference thereto.

BACKGROUND OF THE INVENTION

The invention relates to a method for manufacturing a microelectronic circuit. Furthermore, the invention relates to a corresponding microelectronic circuit.

In the conventional technology, hafnium dioxide ($HfO_2$ or also hafnium(IV) oxide or also hafnia) is often used as a dielectric for microelectronic circuits. For example, it is used as a gate insulator in MISFETs (metal-insulator-semiconductor field effect transistors) or as a dielectric layer of a DRAM memory capacitor. As such, the material is CMOS-compatible, i.e., it may be used with the conventional semiconductor processes for realizing integrated digital or analog circuits. Furthermore, its thickness is scalable and it comprises a high k value. The latter means that it comprises a higher relative permittivity than conventional silicon dioxide. It also comprises a large band gap.

The discovery of ferroelectricity in materials containing hafnium dioxide (in this case with the designation FE-$HfO_2$) (e.g., see T. S. Böschke, J. Müller, D. Bräuhaus, U. Schröder, U. Böttger, "Ferreoelectricity in hafnium oxide thin films", Applied Physics Letters 99, 102903, 2011) has extended the application to the field of ferroelectric memories (with respect to FRAM, see J. Müller, P. Polakowski, S. Mueller, T. Mikolajick, "Ferreoelectric Hafnium Oxide Based Materials and Devices: Assessment of Current Status and Future Prospects", ECS Journal of Solid State Science and Technology, 4 (5), N30-N35, 2015).

In particular, ferroelectric field effect transistors (FeFETs) relying on a shift of the threshold voltage of the FET by switching electric dipoles in the gate dielectric are very suitable elements since hafnium dioxide is an established gate oxide material (e.g., see US 2013/0270619 A1 or DE 10 2014 212 483 A1). For example, capacitors with ferroelectric layers are described in US 2007/0045689 A1 or US 2009/0061538 A1. Ferroelectricity refers to the phenomenon that certain materials with an electrical dipole moment may change the direction of spontaneous polarization by applying an external electric field.

In order to realize memories that are separate or embedded into integrated circuits by means of hafnium dioxide FeFETs, further functional components and, in particular, transistors are necessitated, e.g., as input/output points, as amplifiers or multiplexers, so that applying ferroelectric and non-ferroelectric transistors on a common substrate becomes necessitated. Therefore, corresponding microelectronic circuits comprise very different components, each comprising different structures and manufacturing requirements.

For example, the following steps are performed in the conventional technology after producing a shallow trench isolation (STI) for producing different transistors:

1. The silicon surface is prepared for the ferroelectric transistors.
2. The ferroelectric hafnium dioxide is applied onto the entire substrate.
3. In the areas where standard transistors are to be produced, i.e., in this case transistors without ferroelectric hafnium dioxide, the ferroelectric hafnium dioxide is selectively removed—e.g., by using titanium nitride as a mask.
4. The silicon surface is prepared for the standard transistors.
5. The material for the standard transistors, e.g., non-ferroelectric hafnium dioxide, is applied onto the entire wafer.

This is followed by the conventional CMOS steps in order to produce the structures.

It is disadvantageous that the ferroelectric hafnium dioxide is also subjected to the treatment steps for the other components in step 4. The preparation steps are absolutely necessitated in order to obtain logic transistors comprising sufficient reliability and switching speed. In this case, a nitridation (also used in the conventional technology is the term "nitriding") is performed, e.g., in the form of "rapid thermal nitridation" or plasma nitriding. However, this has a disadvantageous effect on the ferroelectric hafnium dioxide.

Here, logic transistors are generally to be understood as standard transistors serving for realizing a corresponding circuit logic, e.g., for driving transistors with ferroelectric hafnium dioxide. Therefore, both expressions are equivalent to each other. A further problem arises from the polycrystalline structure of the ferroelectric hafnium dioxide and the resulting inhomogeneously distributed surface polarization. In order to control the channel region of a ferroelectric field effect transistor in a stable manner, a homogeneous distribution of the ferroelectric polarization would be desirable.

The disadvantages described do not only relate to hafnium dioxide as a ferroelectric but also to any other material used as a ferroelectric for a ferroelectric capacitor.

The object of the invention is to propose an effective method for manufacturing a microelectronic circuit as well as a corresponding microelectronic circuit. A further object is to propose a method providing increased protection during manufacturing, in particular, for the components comprising sensitive materials.

SUMMARY

According to an embodiment, a method for manufacturing a microelectronic circuit may have the steps of: providing a substrate, producing a source contact, a bulk contact and a drain contact each for a transistor and for a memory transistor, producing, in a common step, an insulating layer of the transistor and an insulating layer of the memory transistor, producing, in a common step, a metal layer of the transistor and a metal layer of the memory transistor, producing at least one capacitor as part of the memory transistor, producing a gate contact connected to the metal layer of the transistor, and producing a gate contact connected to a metal layer of the capacitor of the memory transistor.

According to another embodiment, a microelectronic circuit may have: a substrate, a transistor, a memory transistor having at least one capacitor, and source contacts, bulk contacts and drain contacts for the transistor and the memory transistor, wherein the transistor has at least one insulating layer and at least one metal layer, wherein the memory transistor has at least one insulating layer and at least one metal layer, wherein the insulating layer of the transistor and the insulating layer of the memory transistor are produced in a common step, wherein the metal layer of the transistor and the metal layer of the memory transistor are produced in a common step, wherein a gate contact of the transistor is connected to the metal layer of the transistor, and wherein a gate contact of the memory transistor is connected to a metal layer of the capacitor of the memory transistor.

Hence, in the manufacturing method, two insulating layers and two metal layers are jointly produced in one respective step. This leads to an effective and cost-efficient manufacturing method.

In an embodiment, the jointly produced insulating layers at least partially consist of hafnium dioxide. In an alternative or supplementary embodiment, the jointly produced metal layers at least partially consist of titanium nitride. Depending on the embodiment, individual layers of the microelectronic circuit consist of poly-Si, TiN, $HfO_2$, $SiO_2$ or Si substrate. In one embodiment, the substrate consists of an oxide, and in another embodiment, of a dielectric.

In further embodiments, other layers of the transistor and/or of the memory transistor are also produced.

Here, the memory transistor differs from the (normal) transistor in that the memory transistor comprises a transistor component and a capacitor component serving as memory.

An embodiment consists of producing, from a lower metal layer, from a ferroelectric layer and from an upper metal layer, a ferroelectric capacitor as part of the memory transistor. In this case, the lower metal layer faces the substrate and the upper metal layer faces the gate contact. Due to the connection of the upper metal layer with the gate contact, the ferroelectric layer is also connected to the gate contact of the memory transistor.

In an embodiment, the memory transistor is produced as a transistor comprising a negative capacitance (subthreshold current swing of the transistor <60 mV/dec, so-called "negative capacitance transistor"). For this, in an embodiment, a series connection of a linear dielectric as an insulating layer and a non-linear, ferroelectric dielectric as a ferroelectric layer is produced.

An embodiment provides producing the at least one capacitor of the memory transistor on the insulating layer of the memory transistor. In an embodiment, the capacitor is produced directly on the insulating layer.

An embodiment consists of producing layers of the transistor and layers of the memory transistor on the substrate in a front-end-of-line method.

An embodiment provides producing, on the insulating layer of the transistor, an etch stop layer and a metal layer of the memory transistor in a common step.

An embodiment consists of producing, in a dielectric carrier, layers of the memory transistor and layers of the transistor. Advantageously, the dielectric carrier is applied to the substrate.

An embodiment provides producing, in a dielectric carrier, the transistor and the memory transistor with a back-end-of-line method, and using an aluminum-BEoL method or a copper-BEoL method.

An embodiment consists of producing the lower metal layer of the memory transistor as a conductive path in the dielectric carrier.

"Plug" or "via" are alternate designations for the conductive paths in the dielectric carrier, which advantageously at least partially consist of a metal and, moreover, are electrically conductive.

An embodiment provides producing a further metal layer on the insulating layer and below the lower metal layer of the memory transistor, and producing an intermediate conductive path between the lower metal layer and the further metal layer in the dielectric carrier. In an embodiment, the intermediate conductive path is produced between the transistor component and the capacitor component of the memory transistor. Likewise, the intermediate conductive path is a conductive path in the dielectric carrier, which, however, is located between the two components of the memory transistor.

In an embodiment, the conductive path or the intermediate conductive path consists of tungsten. However, this serves only as an example for any metal.

An embodiment consists of producing, in the dielectric carrier, a conductive path between the gate contacts and the transistor or the memory transistor, respectively.

An embodiment provides producing a metal layer—in an embodiment, this refers to the previously mentioned further metal layer—and the insulating layer of the memory transistor as parts of a MOS capacitor. A MOS capacitor (an alternative term is MIS capacitor) is a capacitor comprising a metal-insulator-semiconductor structure. Hence, in this embodiment, the memory capacitor comprises two capacitors: a ferroelectric one and a MOS capacitor. In a further embodiment, the transistor also comprises a MOS capacitor.

In an embodiment, a semiconductor layer is produced—advantageously in the substrate—below the insulating layer. The further metal layer, the insulating layer and the semiconductor layer are thereby produced in such a way that together they form a MOS capacitor. In an embodiment, the semiconductor layer consists of silicon.

An embodiment consists of producing the ferroelectric capacitor with a smaller area than the MOS capacitor.

An embodiment provides producing the ferroelectric capacitor with a smaller capacitance than the MOS capacitor.

An embodiment consists of producing the MOS capacitor as a FinFET. In this case, a FinFET is a non-planar MOSFET whose conductive channel is located at a thin silicon fin.

An embodiment provides forming the insulating layer of the memory transistor and the insulating layer of the transistor by a continuous layer.

An embodiment consists of forming a metal layer of the memory transistor and the metal layer of the transistor by a continuous layer.

The aforementioned continuous layers are then structured to produce the memory transistor and the transistor.

An embodiment provides that the nitriding steps that may be used during manufacturing are performed before producing the ferroelectric layer.

The invention further achieves the object by means of a microelectronic circuit which has advantageously been manufactured according to at least one of the above-described embodiments of the inventive method.

In this case, the microelectronic circuit comprises: a substrate, a transistor, a memory transistor comprising at least one capacitor, and source contacts, bulk contacts and drain contacts for the transistor and the memory transistor. In this case, the transistor comprises at least one insulating layer and at least one metal layer. The memory transistor comprises at least one insulating layer and at least one metal layer. The insulating layer of the transistor and the insulating layer of the memory transistor are produced in a common step, and the metal layer of the transistor and the metal layer of the memory transistor are produced in a common step. A gate contact of the transistor is connected to the metal layer of the transistor, and a gate contact of the memory transistor is connected to a metal layer of the capacitor of the memory transistor.

Thus, the transistor comprises an insulating layer and a metal layer as well as source contacts, bulk contacts, drain contacts and gate contacts.

The memory transistor comprises a capacitor connected to the gate contact of the memory transistor. Thus, the capacitor is located, in particular, between the actual transistor component of the memory transistor and the gate contact of the memory transistor.

Therefore, the microelectronic circuit comprises a low-cost manufacturing due to producing insulating layers and metal layers of the transistor and of the memory transistor in a respective common step. In an embodiment, this is further simplified by the concerned insulating layers and/or the metal layers being continuous layers which are to be structured correspondingly.

The above-described manufacturing steps lead to corresponding microelectronic circuits, so that the above statements correspondingly also lead to embodiments of the inventive microelectronic circuit. Correspondingly, embodiments of the microelectronic circuit are to be produced by means of corresponding manufacturing embodiments, so that the statements regarding the microelectronic circuit also apply to the manufacturing process.

For example, the microelectronic circuit produced is a chip comprising a CPU and a memory integrated thereon.

For example, the transistor is a conventional logic transistor comprising, in an embodiment, a metal-insulator-semiconductor (MIS) structure. The memory transistor also performs a memory function and, in an embodiment, substantially comprises the following structure: semiconductor-insulator-metal-ferroelectric-metal.

The transistor and the memory transistor are arranged side by side on the substrate.

In an embodiment, the transistor and/or the memory transistor comprise additional insulating layers and/or metal layers.

In an embodiment, the transistor is configured such that it at least partially serves to drive the memory transistor.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
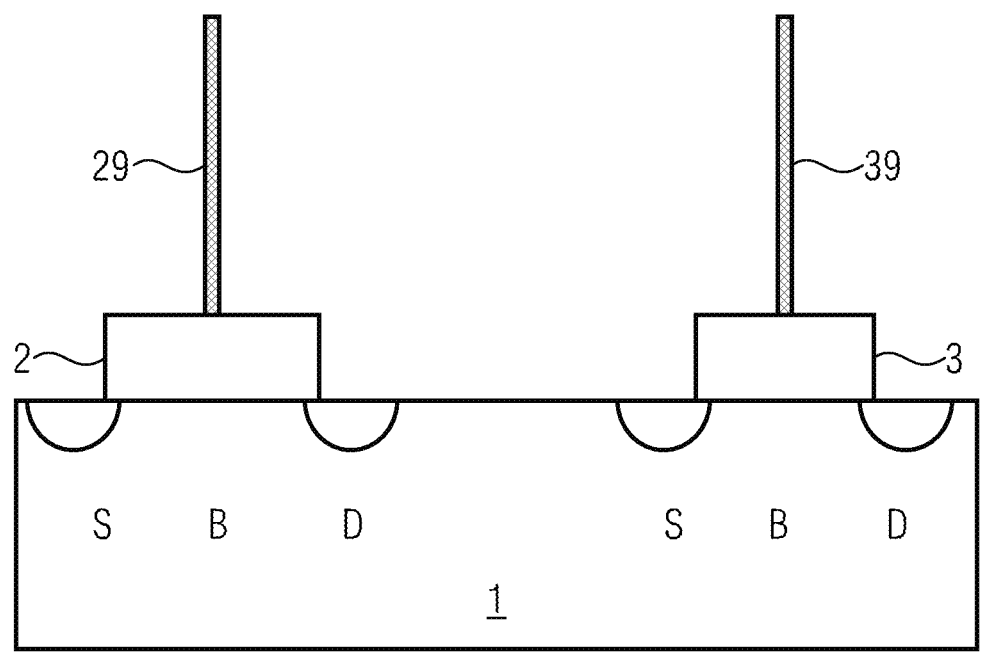
FIG. 1 shows a section through a schematic microelectronic circuit according to a first embodiment.

FIG. 1 shows a section through a schematic microelectronic circuit (an alternative designation is chip) of a first embodiment. A transistor 2 and a memory transistor 3 are located next to each another on an advantageously dielectric substrate 1 (alternative designations are carriers or wafers). The memory transistor 3 is distinguished by the fact that it comprises a capacitor located between the layers of the actual transistor and the gate contact 39. In the illustrated example, in the substrate 1, respective associated source contacts S, bulk contacts B and drain contacts D have been produced for the transistor 2 and the memory transistor 3. A gate contact 29, 39 is located above the transistor 2 and the memory transistor 3, respectively.

Figure 2:
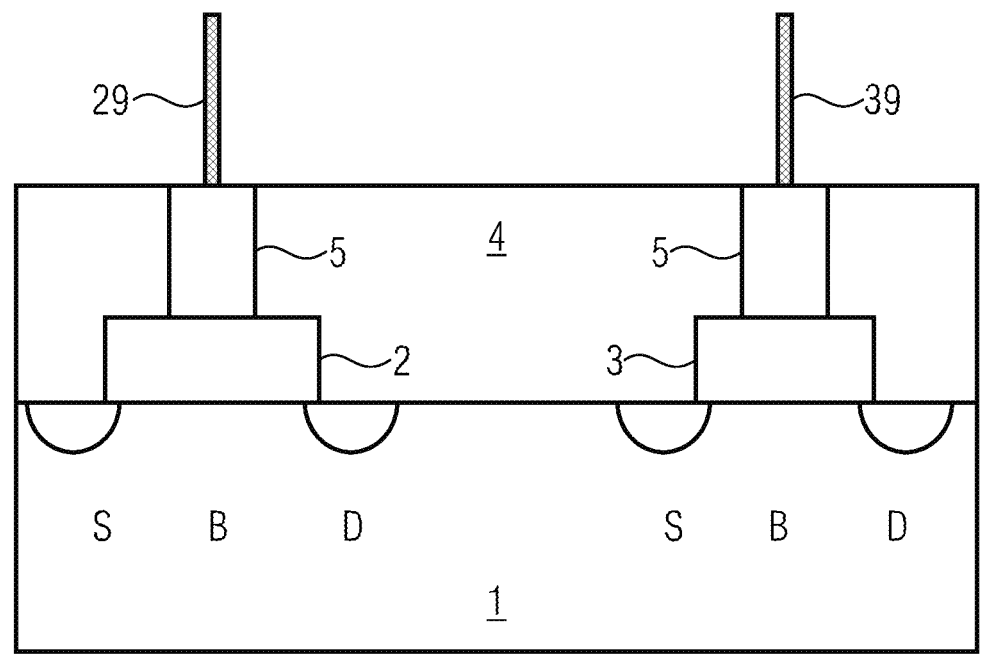
FIG. 2 shows a section through a schematic microelectronic circuit according to a second embodiment.

Whereas in the embodiment of FIG. 1, the transistor 2 and the memory transistor 3 are located above the substrate 1, in the embodiment of FIG. 2, they are embedded in a dielectric carrier 4. A metallic conductive path 5 is located above the transistor 2 and the memory transistor 3, respectively, which leads to the upper side of the dielectric carrier 4 and there permits a connection to a gate contact 29, 39.

Figure 3:
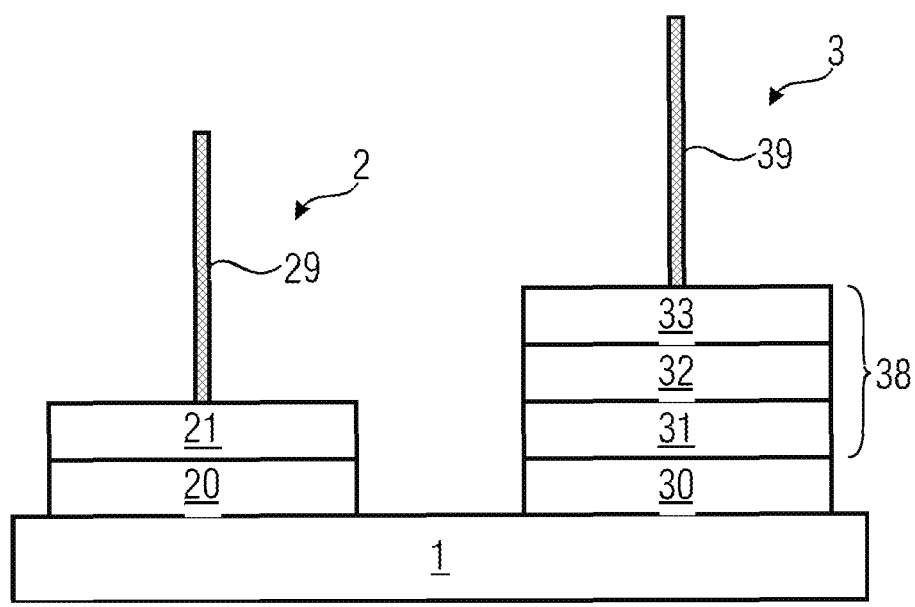
FIG. 3 shows the microelectronic circuit according to the first embodiment in a detailed step.

FIG. 3 shows the layer structure of an embodiment of the microelectronic circuit according to the embodiment of FIG. 1. The abovementioned source contacts, bulk contacts and drain contacts are located in the substrate 1 and are not shown for the sake of clarity.

Above the substrate 1, the transistor 2 comprises an insulating layer 20 and a subsequent metal layer 21 connected to the gate contact 29. In this context, the term "above" refers to the indication relative to the substrate 1 which virtually forms the base layer.

The memory transistor 3 also comprises an insulating layer 30. The insulating layer 20 of the transistor 2 and the insulating layer 30 of the memory transistor 3 are produced in a common step and thus simultaneously.

Above the insulating layer 30, the memory transistor 3 comprises a ferroelectric capacitor 38 connected to the gate contact 39 and thereby also arranged between the layers, which function as a transistor, and the gate contact 39. The ferroelectric capacitor 38 is formed by a lower metal layer 31, a ferroelectric layer 32 and an upper metal layer 33. In this case, the ferroelectric layer 32 consists of a ferroelectric. For example, it is ferroelectric hafnium dioxide. In terms of the invention, "ferroelectric hafnium dioxide" is to be understood to mean a material comprising—at least partially—doped or undoped hafnium dioxide or a mixed oxide of $HfO_2$ and $ZrO_2$ (e.g., $HfO_2$—$ZrO_2$) and thus obtaining ferroelectric properties. If a doping is present, this is, e.g., a doping with Si, Al, Y, Gd, Sr, Zr, etc.

The capacitor 38 may also be described as comprising a bottom electrode (provided by the lower metal layer 31), a ferroelectric layer 32 and a top electrode (provided by the upper metal layer 33). Thus, a so-called MFM capacitor or ferroelectric capacitor 38 is produced.

In the variation of FIG. 3, the ferroelectric capacitor 38 is applied directly on the substrate 1. If, in an alternative embodiment, the ferroelectric capacitor 38 is arranged on higher layers (so-called Back-End-of-Line (BEoL) layers), the capacitor (as a capacitor component of the memory transistor) is connected to the gate of a transistor (as a transistor component of the memory transistor). In this case, the shape of the transistors is not relevant, so that the method may also be used for FinFET or Gate-all-around (GAA) FETs. More information regarding this will be provided in the following.

For the embodiment shown, during manufacturing the microelectronic circuit, the metal layer 21 of the transistor 2 and the lower metal layer 31 of the memory transistor 3 or the metal layer 21 of the transistor 2 and the upper metal layer 33 of the memory transistor 3 are produced in a common step. If the metal layer 21 of the transistor 2 and the lower metal layer 31 of the memory transistor 3 are produced together, advantageously the metal layer 21 of the transistor 2 is particularly protected during the production of the further layers of the memory transistor 3. In the alternative embodiment, the insulating layer 20 of the transistor 2 is to be protected.

The manufacturing steps according to the alternative, in which the metal layer 21 of the transistor 2 and the upper metal layer 33 of the memory transistor 3 are produced in a common step, are shown in FIGS. 4 to 9.

Further sub-steps not discussed in detail herein include, e.g., preparing the surface of a side of the substrate 1 for the application of a material layer.

In this case, it is also shown in the illustrations described below that the respective insulating layers 20, 30 and metal layers 21, 33 produced together are continuous and uninterrupted layers.

Figure 4:
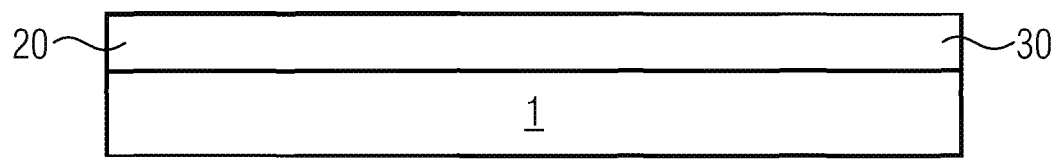
FIG. 4 shows the microelectronic circuit according to the first embodiment in a first phase of manufacturing.

FIG. 4 shows the substrate 1, on which the insulating layer 20 of the transistor and the insulating layer 30 of the memory transistor have been applied as a continuous layer in a common step. Here, the source contacts, bulk contacts and drain contacts in the substrate 1 are not illustrated. In this case, established CMOS methods have been used, also producing trench isolations, contacts and logic components or structures. Further functional units such as n-channel metal-oxide-semiconductor field effect transistors (NMOS) or p-channel metal-oxide-semiconductor field effect transistors (PMOS) are also present.

Figure 5:
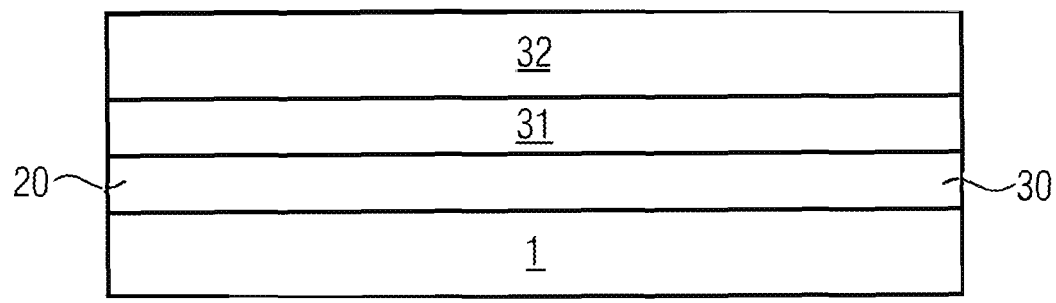
FIG. 5 shows the microelectronic circuit of FIG. 4 in a second phase of manufacturing.

In the phase illustrated in FIG. 5, an insulated potential-free metal layer 31—in this case, e.g., made of titanium nitride—was applied on the continuous insulating layer 20, 30. In the further steps, this metal layer 31 serves as an etch stop layer for the partial removal of the ferroelectric layer 32 applied above the metal layer 31. In addition, the bottom electrode (or the lower metal layer) of the ferroelectric capacitor of the memory transistor is produced from the continuous metal layer 31 by a corresponding structuring.

Figure 6:
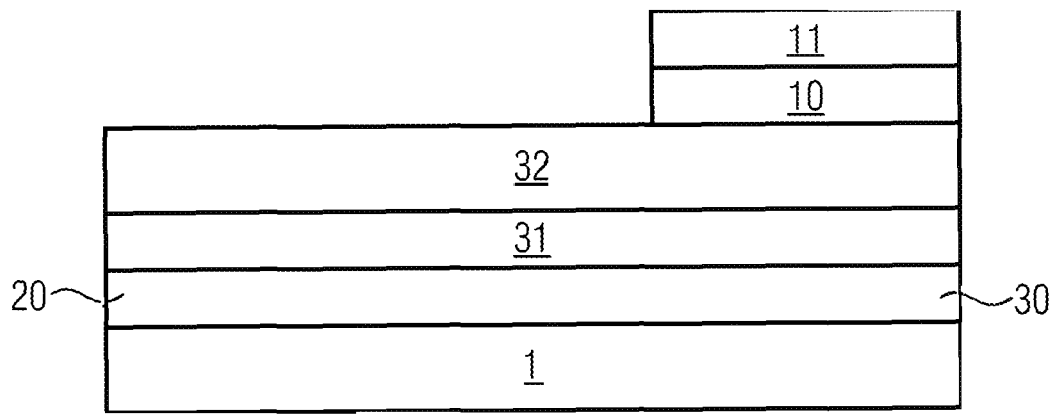
FIG. 6 shows the microelectronic circuit of FIG. 4 in a third phase of manufacturing.

In the next step of FIG. 6, photolithographic patterning has been performed by a mask 10—in this case, e.g., with titanium nitride—above the ferroelectric layer 32. Above the mask 10, a cover lacquer 11 has also been applied. This is particularly the case in the portion in which the memory of the memory transistor, which is embodied as capacitor, is to be arranged.

Figure 7:
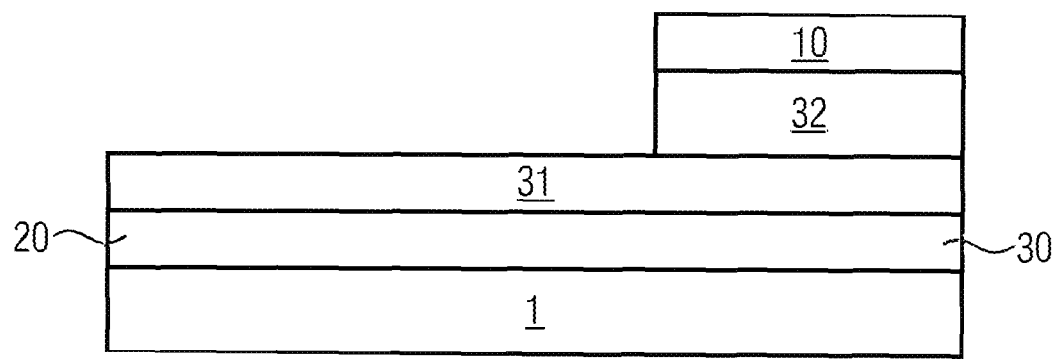
FIG. 7 shows the microelectronic circuit of FIG. 4 in a fourth phase of manufacturing.

In the phase of FIG. 7, the ferroelectric layer 32, which—in the example shown—is embodied in a thick manner, was removed by a dry or wet etching process, except for the portion in which the capacitor of the memory transistor 3 is produced. In this case, the metal layer 31 acted as an etch stop.

Figure 8:
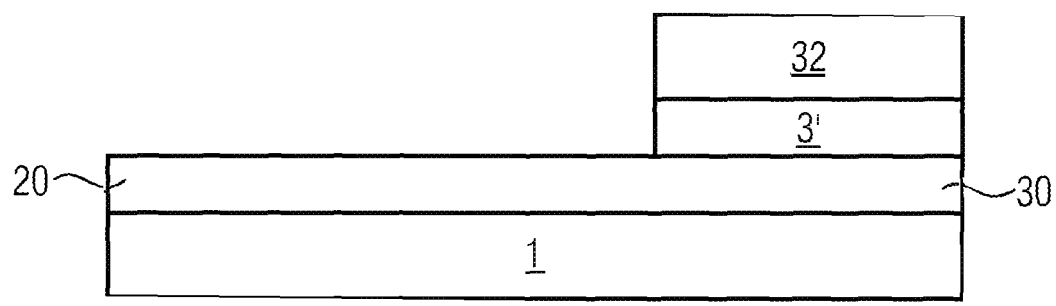
FIG. 8 shows the microelectronic circuit of FIG. 4 in a fifth phase of manufacturing.

In the phase of FIG. 8, the metal layer 31 was reduced by the mask 10 to the portion of the capacitor of the memory transistor to be produced.

Figure 9:
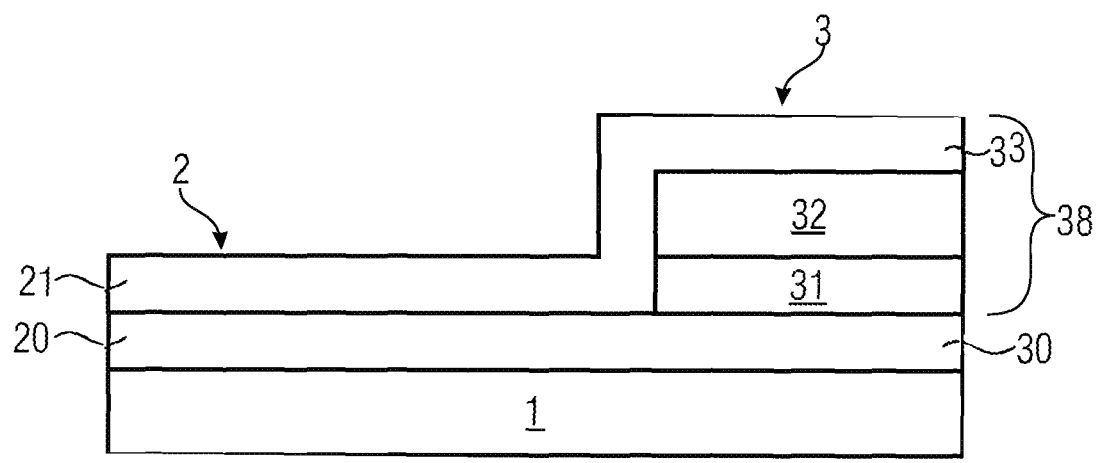
FIG. 9 shows the microelectronic circuit of FIG. 4 in a sixth phase of manufacturing.

In the phase of FIG. 9, a metal gate layer (advantageously also made of titanium nitride) was applied, partly serving as a top electrode (or upper metal layer 33) of the ferroelectric capacitor 38 and laterally extending on the ferroelectric layer 32 to the transistor 2. Thus, this metal layer is also the metal layer 21 of the transistor 2. Thus, the upper metal layer 33 of the memory transistor 3 and the metal layer 21 of the transistor 2 are applied in a common step.

This is followed by the conventional CMOS steps for configuring the gate structures, e.g., depositing a gate layer, applying a mask and structuring the same.

Instead of the titanium nitride (TiN), a nitride of another transition metal may generally be used (TaN, HfN or WN), so that the titanium nitride is only an example.

The great advantage of presetting the sequence of steps is that the memory transistor 3 is not exposed to the steps or sub-steps that may be used for producing the transistor 2, i.e., the materials used or the environmental influences during production of the transistor 2 do not act on the memory transistor 3.

In some embodiments, a further advantage results from a conductive connection via the continuous metal layer 21, 33 between the transistor 2 and the memory transistor 2. This conductive connection acts as an electrode connected between and distributes the inhomogeneous polarization of the ferroelectric homogeneously to the underlying structure and, therefore, to the channel portion of the transistor.

Figure 10:
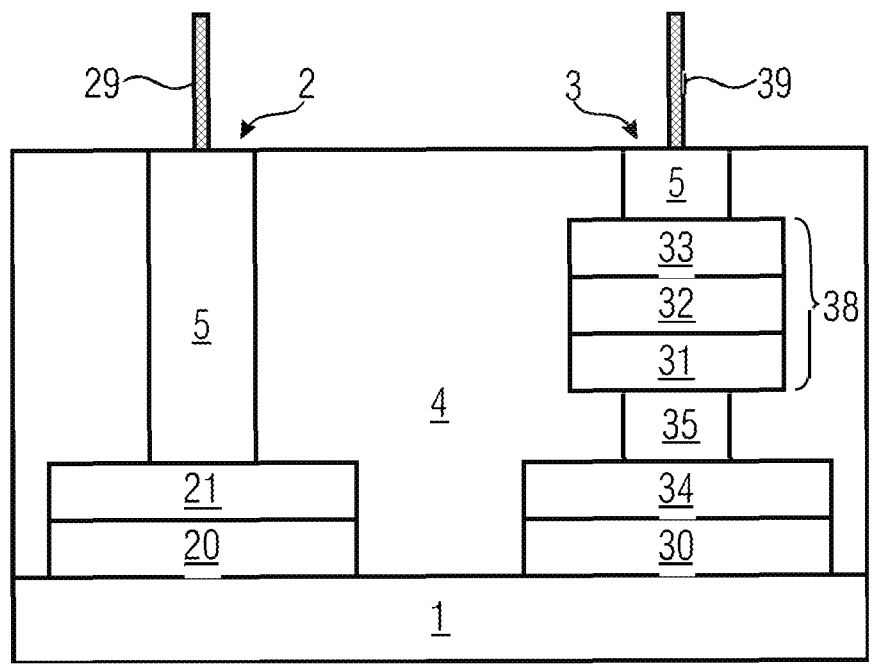
FIG. 10 shows a section through the microelectronic circuit according to the second embodiment in a first variation.

In the second embodiment of the microelectronic circuit of FIG. 10, a dielectric carrier 4 is located on the substrate 1. In this case, the layers of the transistor 2 and of the memory transistor 3 are produced in the dielectric carrier 4. Here, the source contacts, bulk contacts and drain contacts in the substrate 1 are not illustrated.

The transistor 2 comprises an insulating layer 20 and a metal layer 21. Adjacent to the metal layer 21 is a conductive path 5 leading to the upper side of the dielectric carrier 4 and, there, allowing the connection of a gate contact 29. In this case, the insulating layer 20 has been produced in one step together with an insulating layer 30 of the memory transistor 3, and the metal layer 21 has been produced in a further step together with a metal layer (in this case, particularly the further metal layer) 34 of the memory transistor 3.

The memory capacitor 3 comprises the following structure above the substrate 1 in ascending order: an insulating layer 30 followed by a further metal layer 34 followed by an intermediate conductive path 35 followed by a ferroelectric capacitor 38—consisting of a lower metal layer 31, a ferroelectric layer 32 and an upper metal layer 33—as well as a conductive path 5. In this case, the conductive path 5 also ends on the upper side of the dielectric carrier 4 and allows contacting with a gate contact 39.

Thus, the ferroelectric capacitor 38 is connected as a capacitor component of the memory transistor 3 to the layers 30, 34 of the transistor component of the memory transistor 3 via a conductive path (here referred to as an intermediate conductive path) 35 in the dielectric carrier 4. On the other hand, the ferroelectric capacitor 38 is connected to the gate contact 39 via another conductive path 5.

Figure 11:
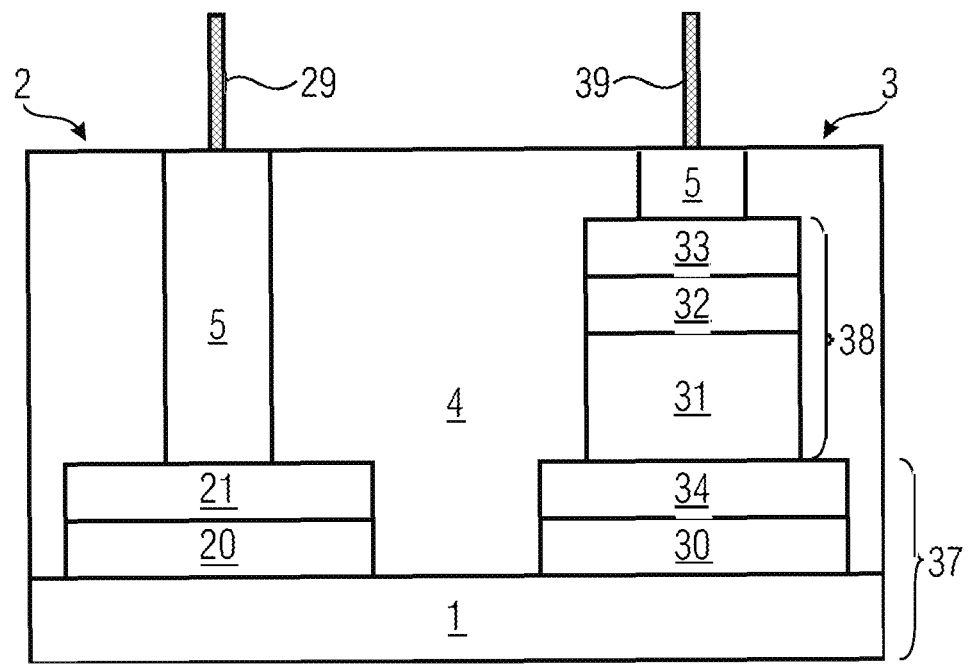
FIG. 11 shows a section through the microelectronic circuit according to the second embodiment in a second variation.

The embodiments of FIGS. 10 and 11 differ with respect to the memory transistor 3, so that only this is described here. In the variation of FIG. 11, the lower metal layer 31 of the ferroelectric capacitor 38 is implemented in the form of a conductive path. A step is omitted in which only a conductive path is formed as the lower metal layer 31 but not the intermediate conductive path 35 and the lower metal layer 31 (see FIG. 10). However, at the same time, the area of the ferroelectric capacitor 38 is coupled to the width of the conductive path.

Figure 12:
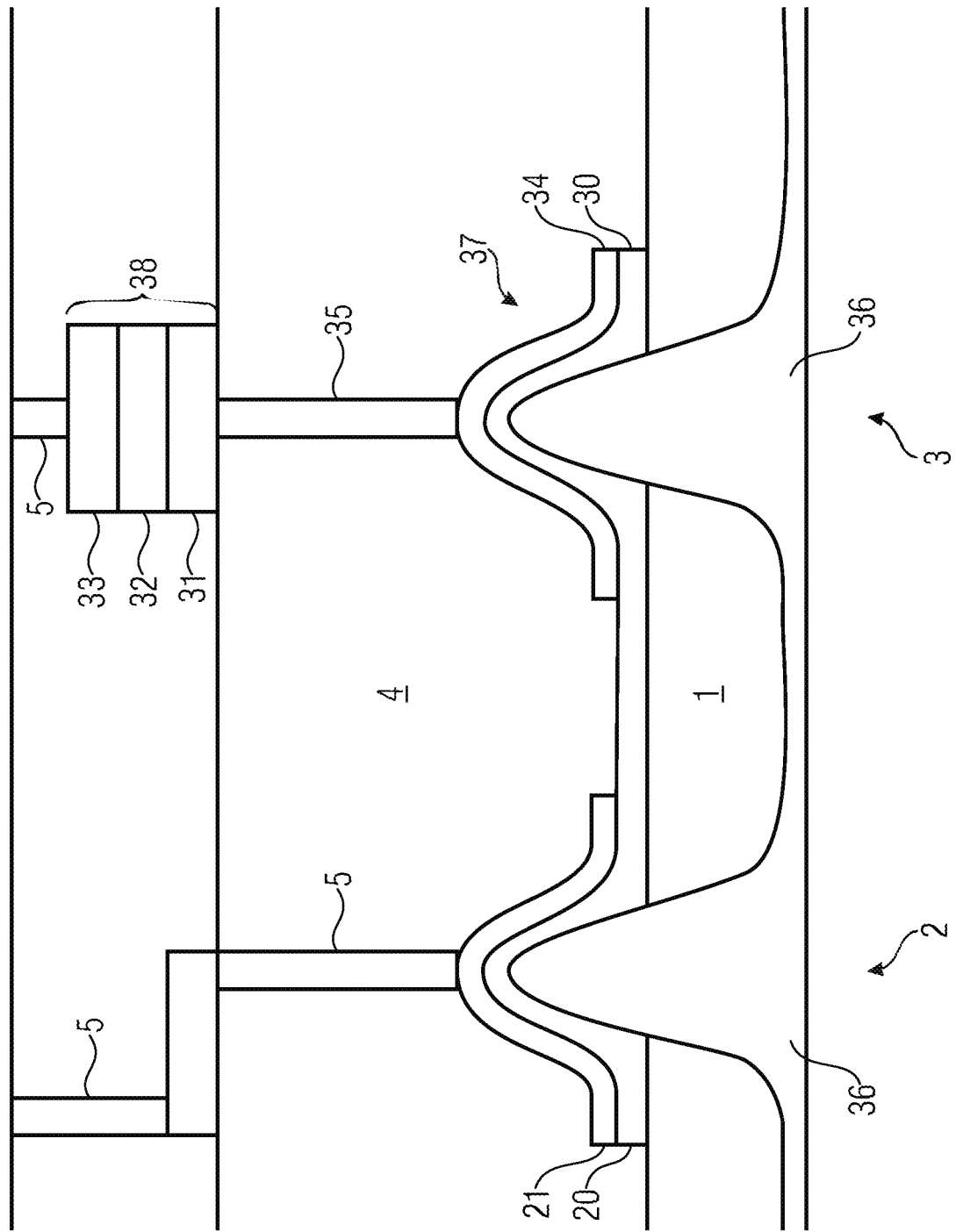
FIG. 12 shows a section through the microelectronic circuit according to the second embodiment in a third variation.

In the embodiment of the microelectronic circuit of FIG. 12, the MOS portion in the memory transistor 3 and in the transistor 2 is embodied as a fin.

In the dielectric carrier 4, two metallic conductive paths (e.g. made of tungsten) comprising a metallic intermediate layer (e.g. made of copper) therebetween are provided adjacent to the metal layer 21 of the transistor 2. Here, the dielectric carrier 4 comprises two layers located one above the other and above the substrate 1. This indicates that the ferroelectric capacitor 38 is located in the metallization plane of the dielectric carrier 4. This results in a lower thermal budget for the memory transistor 3.

Below the continuous and common insulating layers 20, 30 of the transistor 2 and of the memory transistor 3, respectively, there is a semiconductor layer 36 projecting through the substrate 1 and made of, e.g., silicon. In the memory transistor 3, the semiconductor layer 36, the insulating layer 30 and the further metal layer 34 form a MOS capacitor 37. In the transistor 2, the semiconductor layer 36, the insulating layer 30 and the metal layer 21 also form a MOS capacitor.

In an alternative embodiment—not illustrated—, the substrate comprises two fins thusly located below the transistor and the memory transistor. Furthermore, the correspondingly embodied substrate is embedded in a field insulation—for example made of $SiO_2$.

The MOS capacitor 37 of the memory transistor 3 is connected to the ferroelectric capacitor 38 via the intermediate conductive path 35 (e.g. made of tungsten) in the dielectric conductor 4. The ferroelectric capacitor 38 is formed of the lower metal layer 31, the ferroelectric layer 32 and the upper metal layer 33, wherein, in an embodiment, the following material sequence follows: titanium nitride, ferroelectric hafnium dioxide, titanium nitride. Above the ferroelectric capacitor 38 there is also a conductive path 5—e.g. made at least partially of tungsten—leading to the upper side of the dielectric carrier 4.

In this case, the MOS capacitor 37, which is a FinFET, and the ferroelectric capacitor 38 are embodied and produced in such a way that the MOS capacitor 37 comprises a larger effective area and, thus, also a larger capacitance than the ferroelectric capacitor 38. This improves the capacitance ratio and, thus, the voltage divider between the two capacitors. In order to achieve high cycle strength of the ferroelectric capacitor 38 as a memory element, the electric field in the ferroelectric 32 is maximized and the electric field in the insulator 31 is minimized. This is achieved by increasing the insulator capacitance (MIS) relative to the capacitance of the ferroelectric capacitor (MFM) in the FinFET.

Another application example of manufacturing a ferroelectric capacitor 38 as part of the memory capacitor 3 is shown in FIGS. 13 to 17 with individual phases of the manufacturing.

Figure 13:
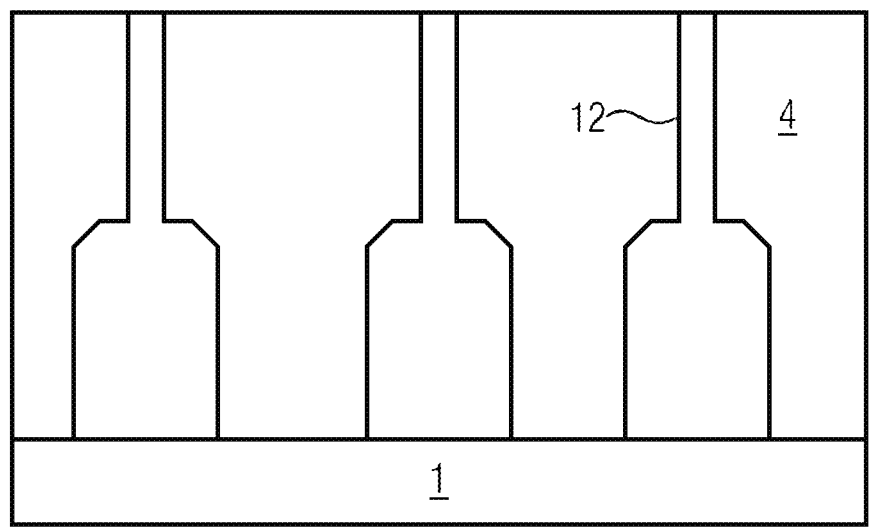
FIG. 13 shows a schematic section through a microelectronic circuit according to the second embodiment in a fourth variation in a first manufacturing phase.
Figure 14:
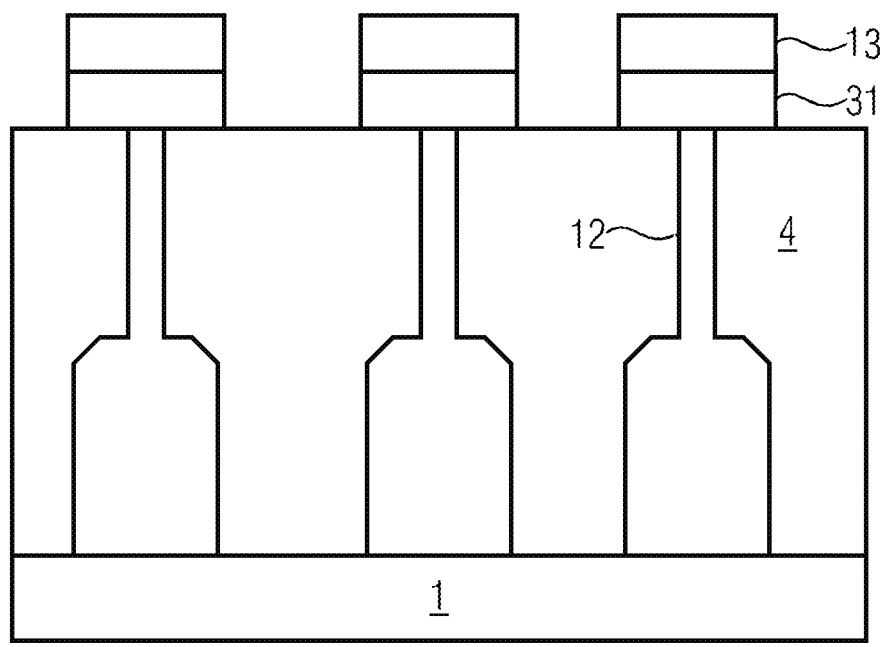
FIG. 14 shows the microelectronic circuit of FIG. 13 in a second phase.

In the first phase of manufacturing shown in FIG. 13, source contacts, drain contacts and gate contacts were produced in the substrate 1 using conventional CMOS methods. However, only the gate contacts 12 are shown for the sake of clarity.

Subsequently, the bottom electrodes (or lower metal layers) 31—e.g. made of titanium nitride—of the ferroelectric capacitor to be manufactured (see FIG. 14) are produced by known methods (applying a suitable layer, partially removing by dry or wet etching). The bottom electrodes 31 comprise an electrically conductive connection with the gate contacts 12. Here, above the bottom electrodes 31, there are lacquer layers 13 allowing the structuring of the bottom electrodes 31. In an alternative—not illustrated—variation, the gate contacts 12 themselves are used as bottom electrodes 31, so that depositing and structuring the bottom electrodes is omitted.

Figure 15:
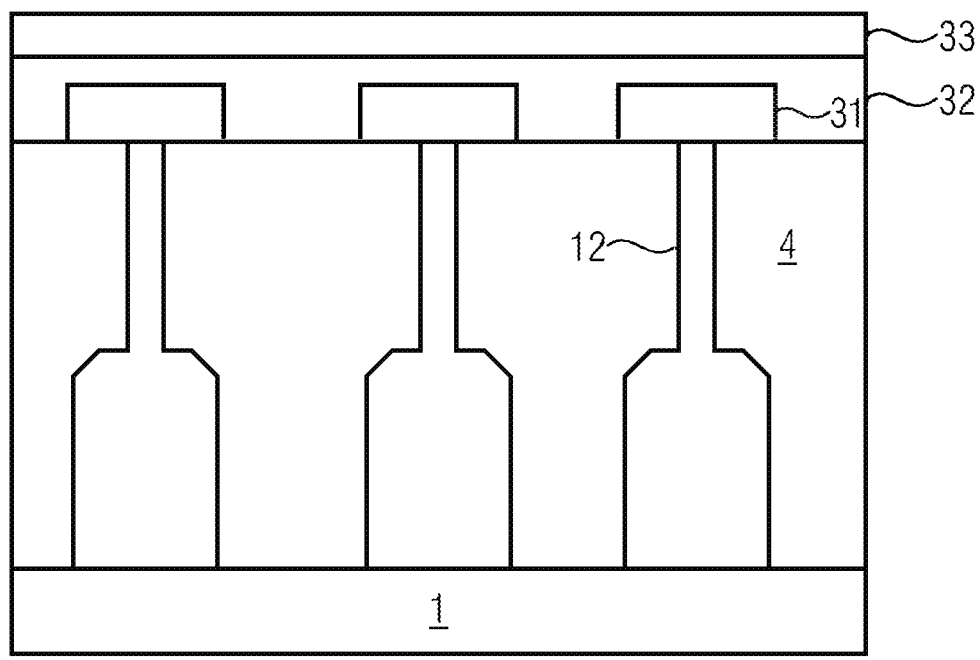
FIG. 15 shows the microelectronic circuit of FIG. 13 in a third phase.

In the next phase of FIG. 15, a thick layer of a ferroelectric (e.g., ferroelectric hafnium dioxide) 32 has been deposited, on which there is a further layer of a metal from which the top electrodes (or upper metal layers 33) of the ferroelectric capacitors are fabricated. In this example, the metal is again titanium nitride.

Figure 16:
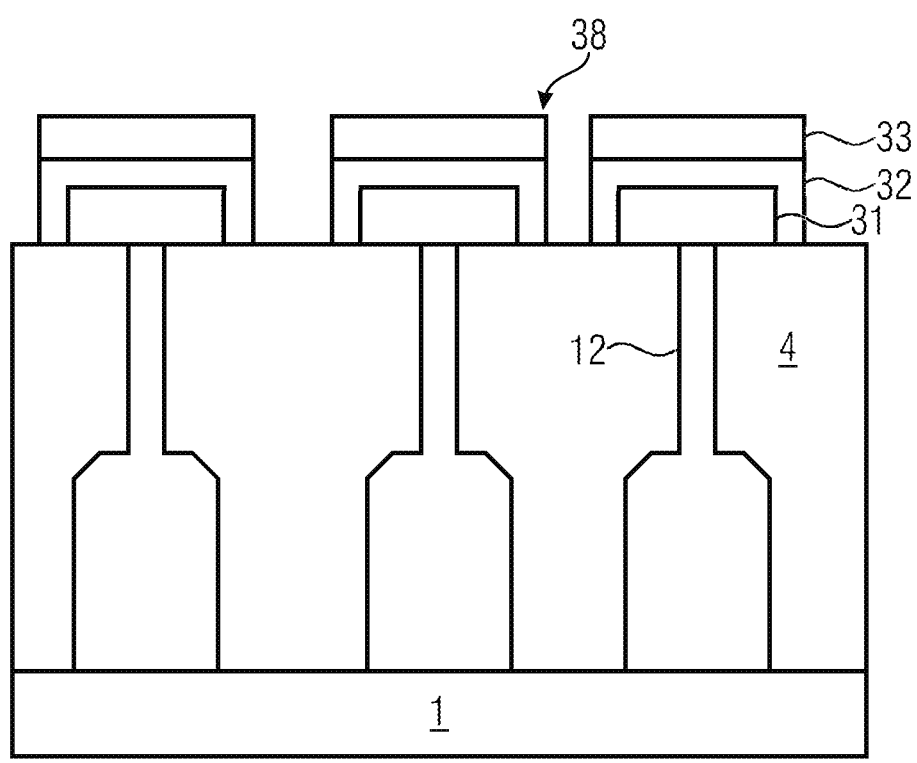
FIG. 16 shows the microelectronic circuit of FIG. 13 in a fourth phase.

The shape of the ferroelectric capacitors 38 may be seen in FIG. 16, in which structuring has been done by etching. Here, the top electrodes 33 are larger than the bottom electrodes 31 in order to protect the sides of the ferroelectric layer 32 during the etching process.

In an alternative—not illustrated—variation, a reversal is carried out: First, the entire metal-ferroelectric-metal layer stack is produced on the substrate. This is followed by a complete etching process, in order to subsequently retract the top electrodes, e.g., wet-chemically.

Figure 17:
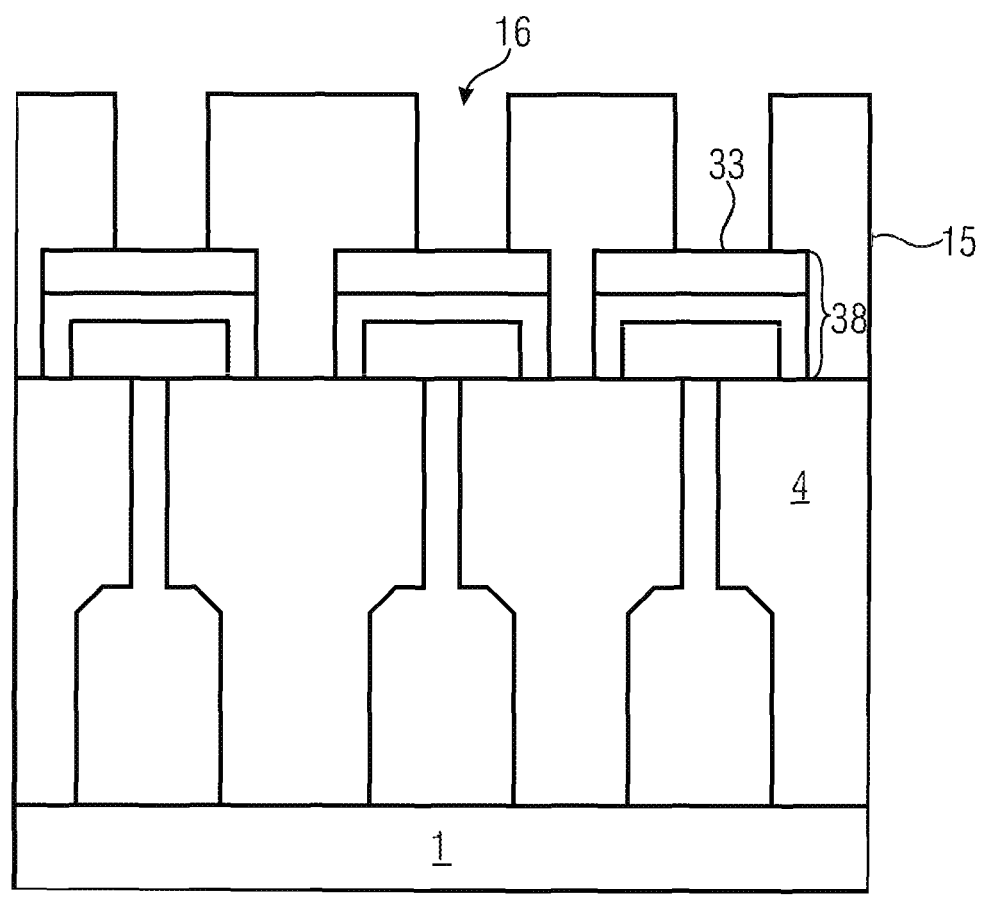
FIG. 17 shows the microelectronic circuit of FIG. 13 in a fifth phase.

In FIG. 17, further steps are indicated. Thus, the ferroelectric capacitors 38 are covered by an insulating layer 15 into which contact holes 16 are introduced in order to contact the top electrodes 33.

Features that have been described with reference to a device—as obvious to those skilled in the art—also represent features of a corresponding method configured to provide a corresponding property. Conversely, features that have been discussed in a method, respectively represent features of a correspondingly produced device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A microelectronic circuit, comprising:
a substrate,
a transistor,
a memory transistor comprising at least one capacitor, and
source contacts, bulk contacts and drain contacts for the transistor and the memory transistor,
wherein the transistor comprises at least one insulating layer and at least one metal layer,
wherein the memory transistor comprises at least one insulating layer and at least one metal layer,
wherein the insulating layer of the transistor and the insulating layer of the memory transistor are produced in a common step, wherein the metal layer of the transistor and the metal layer of the memory transistor are produced in a common step,
wherein the metal layer of the memory transistor and the insulating layer of the memory transistor are parts of a MOS capacitor,
wherein a gate contact of the transistor is connected to the metal layer of the transistor, and
wherein a gate contact of the memory transistor is connected to a metal layer of the capacitor of the memory transistor.

2. The microelectronic circuit of claim 1, manufactured using a method comprising:
providing the substrate,
producing a source contact, a bulk contact and a drain contact each for the transistor and for the memory transistor,
producing, in a common step, an insulating layer of the transistor and an insulating layer of the memory transistor,
producing, in a common step, a metal layer of the transistor and a metal layer of the memory transistor,
producing at least one capacitor as part of the memory transistor,
producing a gate contact connected to the metal layer of the transistor, and
producing the gate contact connected to a metal layer of the capacitor of the memory transistor.

3. A microelectronic circuit, comprising:
a substrate,
a transistor,
a memory transistor comprising at least one capacitor, and
source contacts, bulk contacts and drain contacts for the transistor and the memory transistor,
wherein the transistor comprises at least one insulating layer and at least one metal layer,
wherein the memory transistor comprises at least one insulating layer and at least one metal layer,
wherein the insulating layer of the transistor and the insulating layer of the memory transistor are produced in a common step,
wherein the metal layer of the transistor and the metal layer of the memory transistor are produced in a common step,
wherein a gate contact of the transistor is connected to the metal layer of the transistor, and
wherein a gate contact of the memory transistor is connected to a metal layer of the capacitor of the memory transistor,
wherein the layers of the memory transistor and the layers of the transistor are in a dielectric carrier, and
wherein a further metal layer is on the insulating layer and below a lower metal layer of the memory transistor, and wherein an intermediate conductive path is between the lower metal layer and the further metal layer in the dielectric carrier.

4. The microelectronic circuit of claim 3,
manufactured using a method comprising:
providing the substrate,
producing a source contact, a bulk contact and a drain contact each for the transistor and for the memory transistor,
producing, in a common step, an insulating layer of the transistor and an insulating layer of the memory transistor,
producing, in a common step, a metal layer of the transistor and a metal layer of the memory transistor,
producing at least one capacitor as part of the memory transistor,
producing a gate contact connected to the metal layer of the transistor, and
producing the gate contact connected to a metal layer of the capacitor of the memory transistor.

* * * * *